(12) United States Patent
Matocha et al.

(10) Patent No.: US 10,910,501 B2
(45) Date of Patent: Feb. 2, 2021

(54) STUCTURE AND METHOD FOR SIC BASED PROTECTION DEVICE

(71) Applicant: Monolith Semiconductor Inc., Round Rock, TX (US)

(72) Inventors: Kevin Matocha, Round Rock, TX (US); Kiran Chatty, Round Rock, TX (US); Blake Powell, Round Rock, TX (US); Sujit Banerjee, Round Rock, TX (US)

(73) Assignee: Monolith Semiconductor, Inc., Round Rock, TX (US)

( * ) Notice: Subject to any disclaimer, the term of this patent is extended or adjusted under 35 U.S.C. 154(b) by 0 days.

(21) Appl. No.: 16/121,916

(22) Filed: Sep. 5, 2018

(65) Prior Publication Data

US 2020/0075780 A1 Mar. 5, 2020

(51) Int. Cl.
*H01L 29/861* (2006.01)
*H01L 21/02* (2006.01)
*H01L 21/04* (2006.01)
*H01L 21/761* (2006.01)
*H01L 29/06* (2006.01)
*H01L 29/16* (2006.01)

(52) U.S. Cl.
CPC .... *H01L 29/8611* (2013.01); *H01L 21/02378* (2013.01); *H01L 21/02529* (2013.01); *H01L 21/0465* (2013.01); *H01L 21/761* (2013.01); *H01L 29/0615* (2013.01); *H01L 29/1608* (2013.01)

(58) Field of Classification Search
CPC combination set(s) only.
See application file for complete search history.

(56) References Cited

U.S. PATENT DOCUMENTS

| 4,419,681 A | 12/1983 | Schmitz |
| 6,972,462 B2 | 12/2005 | Orchard-Webb |
| 10,008,592 B1 * | 6/2018 | Kojima ............... H01L 29/7811 |
| 2007/0090360 A1 * | 4/2007 | Dai .................. H01L 29/66136 257/59 |
| 2009/0045457 A1 * | 2/2009 | Bobde ................ H01L 27/0255 257/328 |
| 2010/0237356 A1 * | 9/2010 | Haney ................ H01L 29/1608 257/77 |
| 2013/0334695 A1 * | 12/2013 | Tijssen .................... H01L 23/48 257/773 |
| 2015/0214164 A1 * | 7/2015 | Matocha ............. H01L 29/0615 257/77 |
| 2016/0126306 A1 | 5/2016 | Sdrulla et al. |
| 2017/0117798 A1 * | 4/2017 | Basler ..................... H01L 25/18 |
| 2017/0141222 A1 * | 5/2017 | Harada ............... H01L 29/1095 |
| 2019/0140444 A1 * | 5/2019 | To ......................... G05F 1/618 |

OTHER PUBLICATIONS

Extended European Search Report dated Jan. 22, 2020 for corresponding European Patent Application No. 19195719.0.

* cited by examiner

*Primary Examiner* — Nduka E Ojeh
(74) *Attorney, Agent, or Firm* — Kacvinsky Daisak Bluni PLLC

(57) ABSTRACT

A device may include a P-N diode, formed within a SiC substrate. The device may include an N-type region formed within the SiC substrate, a P-type region, formed in an upper portion of the N-type region; and an implanted N-type layer, the implanted N-type layer being disposed between the P-type region and the N-type region.

13 Claims, 7 Drawing Sheets

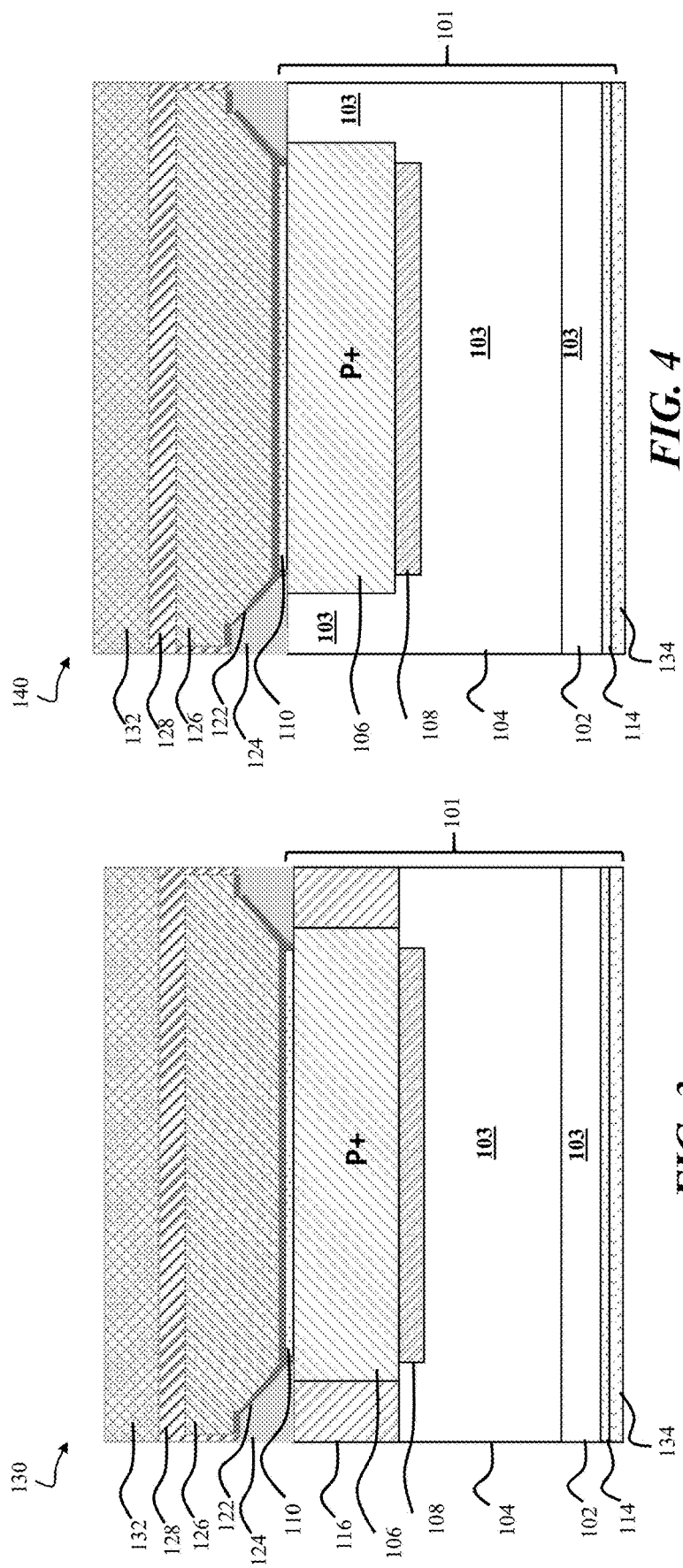

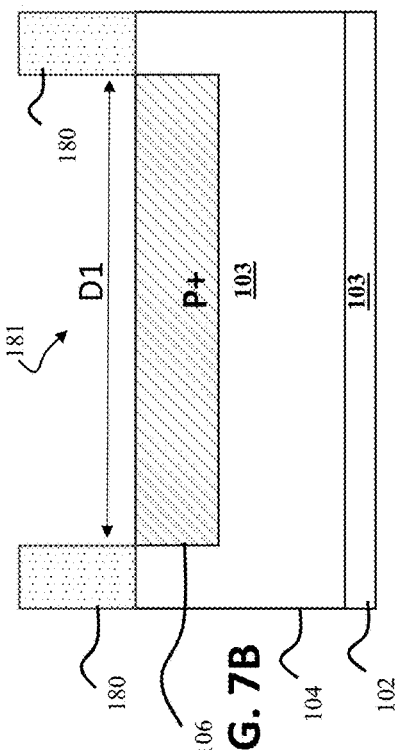
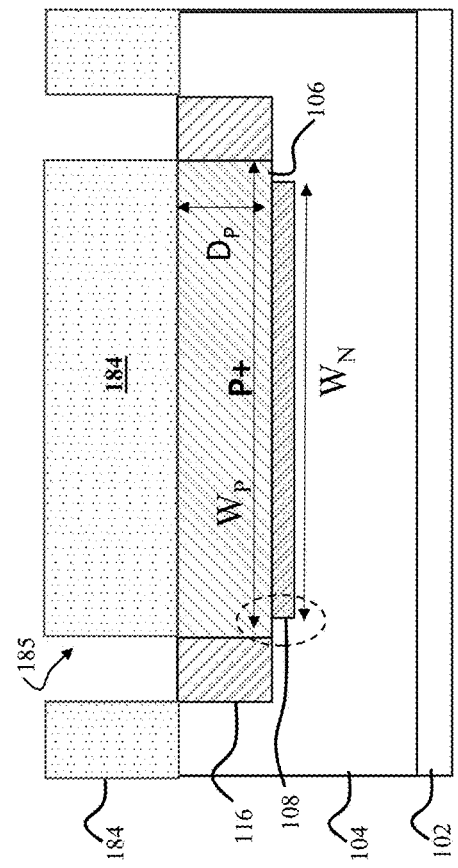
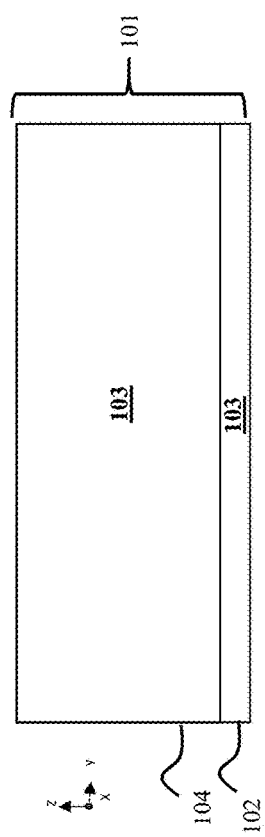
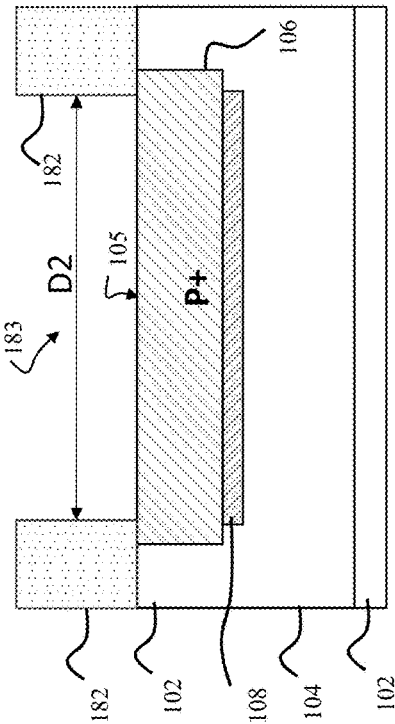
FIG. 7A
FIG. 7B
FIG. 7C
FIG. 7D

STUCTURE AND METHOD FOR SIC BASED PROTECTION DEVICE

STATEMENT REGARDING FEDERALLY SPONSORED RESEARCH

This invention was made with Government support under contract no. W911NF-15-2-0088 awarded by the Department of Defense. The Government has certain rights in the invention.

FIELD

Embodiments of the present disclosure relate generally to protection devices, and in particular to SiC-based TVS diodes.

BACKGROUND

Transient Voltage Suppressor (TVS) diodes are protection diodes designed to protect electronic circuits from voltage transients. The voltage transients are surges in electrical energy with short durations. During normal operation, TVS diodes are designed to minimize leakage current and capacitance. During a voltage transient, the TVS diode operation is triggered to safely discharge the surge current. The peak power ($P_P$) of TVS diodes are characterized for different pulse width ($t_d$) and reported in product datasheets. Commercially available TVS diodes are based on Silicon (Si) technology. Si TVS diodes are designed with different breakdown voltages and power ratings to meet the protection needs for the different applications. For a given breakdown voltage, the peak power rating of the TVS diode is increased by increasing the die size. A TVS diode with a larger die size has a higher current handling capability and therefore a higher peak power rating.

For some applications, TVS diodes are expected to operate at high ambient temperatures. At high temperatures, Si TVS diodes have a high leakage current limiting their maximum operating temperature. At high temperatures, the peak power handling capability of the Si diodes is reduced. In some implementations multiple Si TVS diodes may be connected in series to minimize the power handling of each Si TVS diode. The use of multiple Si TVS diodes entails a higher circuit protection cost. Commercially available Si TVS diodes are limited in breakdown voltage from a few voltages to approximately 600V or less. For applications requiring higher breakdown voltages, multiple Si TVS diodes are used in series, which configuration reduces the peak power rating of the diodes.

In view of the above, silicon carbide (SiC) based TVS diodes have been explored as an alternative to Si TVS diodes. The use of Silicon Carbide (SiC) based TVS diodes is expected to address some of the drawbacks of the Si TVS diodes. For one, due to the large bandgap of the SiC (3.26 eV vs. 1.1 eV for Si), SiC has a lower intrinsic carrier concentration compared to Si. A lower intrinsic carrier concentration allows the SiC diodes to be operated at higher temperatures compared to Si diodes with lower leakage currents. Due to the superior material properties, SiC TVS diodes are expected to have a higher peak power rating compared to Si TVS diodes.

Known TVS diodes based upon SiC may employ an architecture similar to silicon TVS diodes. An N-type substrate may form with bulk of the TVS diode, while an N-type epitaxial layer (epilayer) is formed on the N-type substrate. A highly doped P-type region may then be formed on the N-type epilayer, where a P/N junction, defining properties of the TVS diode, forms between the N-type epilayer and the P-type region. In some implementations, a junction termination region may be formed around the periphery of the P-type region. Notably, further improvements to the SiC TVS diodes may be useful to enable commercialization of this technology. In view of the above, the present disclosure is provided.

SUMMARY

This Summary is provided to introduce a selection of concepts in a simplified form further described below in the Detailed Description. This Summary is not intended to identify key or essential features of the claimed subject matter, nor is this Summary intended as an aid in determining the scope of the claimed subject matter.

In one embodiment, a device is provided. The device may include a P-N diode, formed within a SiC substrate. The device may include an N-type region formed within the SiC substrate, a P-type region, formed in an upper portion of the N-type region; and an implanted N-type layer, the implanted N-type layer being disposed between the P-type region and the N-type region.

In another embodiment, a method of forming a SiC TVS diode, may include providing an N-type region in a SiC substrate. The method may include implanting P-type ions to form a P-type region, extending from a first surface of the N-type region. The method may further include forming an implanted N-type layer by implanting N-type ions, subjacent the P-type region, wherein the implanted N-type layer is disposed between the P-type region and the N-type region.

In an additional embodiment, a SiC TVS device is provided. The SiC TVS device may include a bulk substrate region, the bulk substrate region comprising N-type SiC having a first dopant level. The SiC TVS device may include an epitaxial SiC layer, the epitaxial SiC layer disposed on the bulk substrate region, and comprising an N-type SiC material having a second dopant level. The SiC TVS device may include a P-type region, formed in an upper portion of the epitaxial SiC layer; and an implanted N-type layer, the implanted N-type layer being disposed within the epitaxial SiC layer, subjacent the P-type region, the implanted N-type layer comprising a third dopant level, greater than the second dopant level.

BRIEF DESCRIPTION OF THE DRAWINGS

FIG. 3 shows a TVS diode according to further embodiments of the disclosure;

FIG. 4 shows another TVS diode according to further embodiments of the disclosure;

FIG. 7A-7J shows a process flow for assembling a TVS diode in accordance with embodiments of the disclosure.

DETAILED DESCRIPTION

Figure 1:
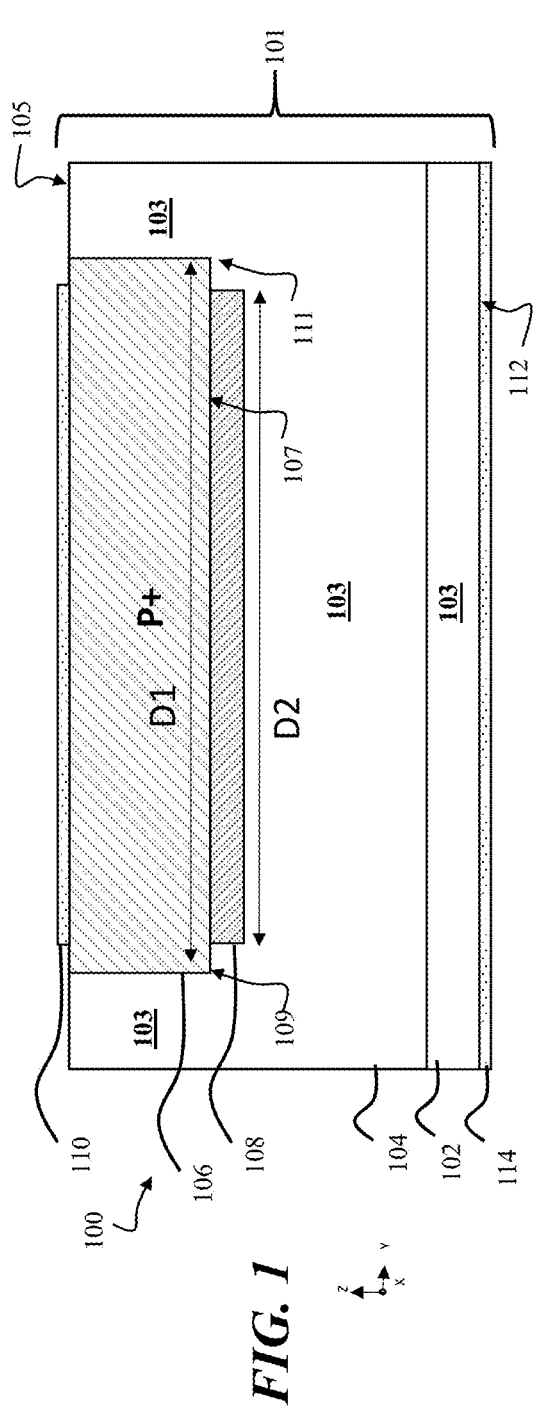
FIG. 1 shows a unidirectional SiC TVS diode, according to an embodiment of the disclosure.

Exemplary embodiments will now be described more fully hereinafter with reference to the accompanying drawings, in which embodiments are shown. The exemplary embodiments, however, may be embodied in many different forms and should not be construed as limited to the embodiments set forth herein. In the drawings, like numbers refer to like elements throughout.

Various embodiments provide novel SiC devices, such as TVS diodes.

FIG. 1 shows a unidirectional SiC TVS diode shown as TVS diode 100, according to an embodiment of the disclosure. This structure of the TVS diode 100 corresponds to P/N diode, formed within a SiC substrate 101. Notably, the various portions of the TVS diode 100 are not necessarily drawn to scale, including the thickness of various regions along the Z-axis of the Cartesian coordinate system shown. The TVS diode may be formed based upon a bulk SiC substrate having a thickness in the range of 100 µm to 375 µm. The embodiments are not limited in this context. In the example of FIG. 1, the TVS diode 100 includes an N-type region 103, including a bulk substrate region 102, where the bulk substrate region 102 may have a thickness of 100 µm to 375 µm, for example. The N-type region 103 may also include an epitaxial SiC layer 104, disposed on the bulk substrate region 102. The epitaxial SiC layer 104 may be formed of an N-type SiC material, similar to or the same as the bulk substrate region 102. For example, the bulk substrate region 102 may be formed of a known hexagonal SiC polytype, having a high bandgap, such as ~3.2 eV. The epitaxial SiC layer 104 may be grown as a hexagonal polytype, where a difference between the epitaxial SiC layer 104 and the bulk substrate region 102 is the level of N-type dopant. In other embodiments, the epitaxial SiC layer 104 may be omitted, as discussed further below. In various embodiments, the thickness of the epitaxial SiC layer 104 may be adjusted to adjust electrical properties of the TVS diode 100, while a representative thickness range is between 1 µm and 10 µm. The embodiments are not limited in this context.

The TVS diode 100 further includes a P-type region 106, formed in an upper portion of the epitaxial SiC layer 104. The P-type region 106 may be defined by a masking approach to occupy a select portion of the upper surface 105, and may extend several micrometers into the SiC substrate 101. The TVS diode 100 may further include an implanted N-type layer 108, the implanted N-type layer being disposed within the epitaxial SiC layer, subjacent the P-type region, the implanted N-type layer comprising a third dopant level, greater than the second dopant level.

The TVS diode 100 may further include an anode contact 110, disposed on the P-type region 106, and a backside contact 114, disposed on a back surface 112 of the SiC substrate 101, in contact with the N-type region 103.

As shown in FIG. 1, the P-type region 106 includes a lower surface 107, where the lower surface 107 extends for a first distance D1 between a first end 109 and a second end 111. The lower surface 107 may serve to define a P/N junction between the P-type region 106 and the N-type region 103. The breakdown voltage of the TVS diode 100 is defined by the breakdown voltage of the P-N diode formed between the P-type region 106 and implanted N-type layer 108. In various implementations, the doping concentration of the P-type region 106 may be fixed, while the breakdown voltage may be modulated by changing an implant dose to form the N-type layer 108, and therefore the doping concentration of the implanted N-type layer 108.

By way of background, the breakdown voltage of a P-N junction diode occurs when the electric field across the P-N junction exceeds the critical breakdown field. The electric field across the P-N junction is determined by the doping concentration of a P-type region and N-type region. In the TVS diode 100, the breakdown voltage may be determined by the doping concentration of the P-type region 106 and the implanted N-type layer 108. For a given P region doping concentration, as the doping concentration of the implanted N-type layer 108 increases, the breakdown voltage of the TVS diode is lowered. The doping concentration of the epitaxial SiC layer 104 is lower than the doping concentration of the implanted N-type layer 108. As a result, the epitaxial SiC layer 104 does not affect the breakdown voltage of the low voltage TVS diode structure.

Notably, for TVS diode structures with low breakdown voltages, where the doping concentration of an N-implanted region needs to be greater than the doping concentration of an N-substrate region, a TVS diode may be fabricated on wafers (substrates) having no N-type epitaxial region. This latter approach may be beneficial for lowering the manufacturing cost of a low voltage TVS diode structure.

To ensure proper device breakdown, the implanted N-type layer 108 may not extend along the entirety of the lower surface 107. In the example of FIG. 1, the implanted N-type layer 108 extends for a second distance D2 along the lower surface 107, less than the first distance D1. Notably, the implanted N-type layer 108 is offset from the first end 109 and the second end 111.

In various embodiments, the doping concentration of bulk substrate region 102 is approximately $10^{18}$ cm$^{-3}$ while the doping concentration of the epitaxial SiC layer 104 ranges from $10^{14}$ to $10^{17}$ cm$^{-3}$.

The doping concentration of the epitaxial SiC layer 104 may be selected such that the breakdown voltage of the P-N diode formed between the P-type region 106 and the epitaxial SiC layer is higher than the P-N diode formed between the P-type region 106 and implanted N-type layer 108. The P-type region 106 may be contacted using ohmic metallization, as represented by the anode contact 110. In various embodiments, metallization schemes may include Nickel (Ni) or Titanium (Ti) based contacts. The N-type region 103 may be contacted on the surface 112 of the SiC substrate 102 using Ni contacts, in one example.

In some embodiments for implementing a low voltage SiC TVS having a breakdown voltage of 30V, for example, the peak doping concentration of the P-type region 106 may be on the order of $10^{20}$ cm$^{-3}$. The doping concentration of the implanted N-type layer 108 may be of the order of $10^{18}$ cm$^{-3}$. For proper operation of the TVS diode 100, the doping concentration of the epitaxial SiC layer 104 is arranged to be lower than the doping concentration of the implanted N-type layer 108. For example, the doping concentration of the epitaxial SiC layer 104 may be in the order of $10^{16}$ cm$^{-3}$.

Figure 2:
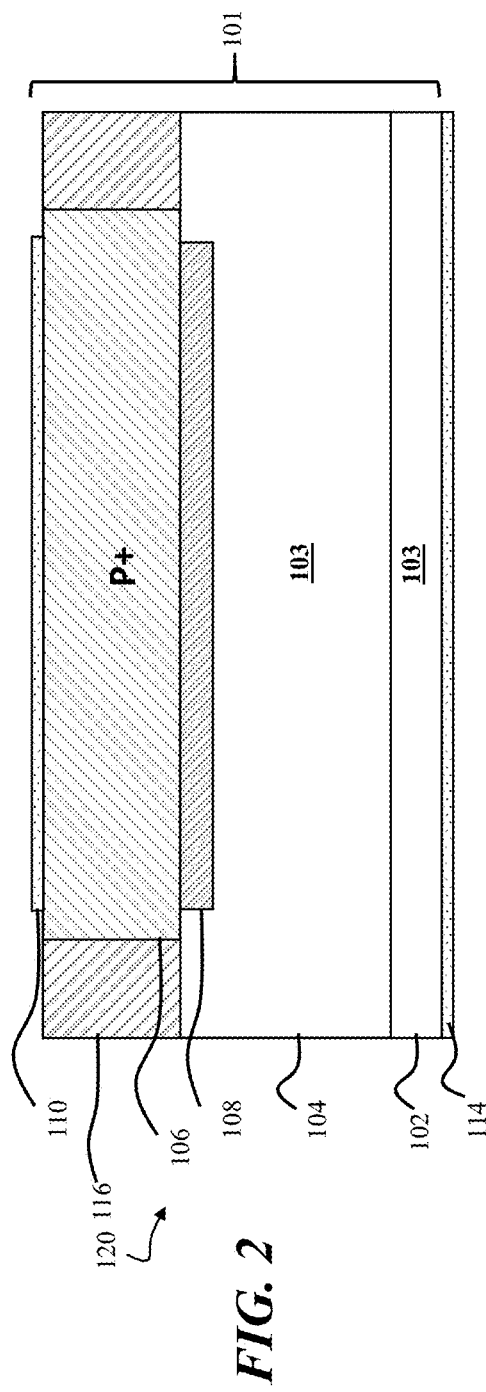
FIG. 2 shows an embodiment of a TVS diode, arranged in accordance with additional embodiments of the disclosure.

Turning now to FIG. 2, there is shown an embodiment of a TVS diode 120, arranged in accordance with additional embodiments of the disclosure. The TVS diode 120 may share the same components of the TVS diode 100, with a difference in the addition of a junction termination extension region (JTE region), shown as the JTE region 116. The JTE region 116 is disposed within the epitaxial SiC layer 104, around the P-type region 106, and forms an interface region with a portion of the epitaxial SiC layer 104. Notably, the P-type region 106 may have a first p-doping level, where the JTE region 116 is formed with a P-type dopant having a second p-doping level, less than the first p-doping level. According to embodiments of the disclosure, the JTE region 116 may be defined by an ion implantation operation to establish a region having a lower doping concentration of p-dopant to surround the P-type region 106. In some embodiments, the doping concentration of the JTE region 116 is on the order of $10^{17}$ cm$^{-3}$. As such, the JTE region 116 may reduce the surface electric fields at the device edges to ensure that the TVS diode 120 does not breakdown below the targeted value.

Turning now to FIG. 3 there is shown a TVS diode 130 according to further embodiments of the disclosure. The embodiment of FIG. 3 shares similar features to the features of the TVS diode 120 of FIG. 2, with additional features not present in the TVS diode 120, including an optional barrier layer, shown as a metal layer structure, denoted as barrier metal layer 122, disposed over the anode contact 110. The TVS diode 130 further includes a metallization region 126, formed within a window defined by a field oxide region, shown as field oxide layer 124. The barrier metal layer 122 may be Ti or a combination of Ti with titanium nitride (TiN) according to some embodiments. The metallization region 126 may be an aluminum:copper alloy material in some embodiments, and may have a thickness of greater than one micrometer, such as four micrometers in particular embodiments. The TVS diode 130 may further include a passivation layer 128, disposed over the metallization region 126. An example of a suitable materials system for the passivation layer 128 is phosphosilicate glass (PSG) and silicon nitride (SiN$_x$). In one example the thickness of the PSG may be 500 nm, while the thickness of the SiN$_x$ may be 850 nm. The embodiments are not limited in this context. As shown in FIG. 3, a polymer layer 132, such as polyimide, is provided over the passivation layer 128. The polymer layer 132 and passivation layer 128 may be subsequently provided with an opening (not shown) to allow electrical contact with the TVS diode 130, and assembly. A solderable front side metallization layer containing Nickel/Gold or Nickel/Palladium/Gold may also be present over the metallization region 126. Notably, in the embodiments of FIG. 1 and FIG. 2, a similar metallization and passivation scheme may be added to the respective TVS diodes, or another known suitable metallization scheme to provide for contacting the TVS diodes.

In the embodiments discussed above, where a epitaxial SiC layer 104 is provided, the doping levels and thickness of the various regions may be readily adjusted to produce a targeted breakdown voltage, greater than 20 V while less than 650 V. In particular embodiments, the doping concentration of the epitaxial SiC layer 104 region is less than the doping concentration of implanted N-type layer 108. The doping concentration and thickness of implanted N-type layer 108 may be >$10^{16}$ cm$^{-3}$ and less than 10 µm, respectively. The doping level of the P-type region 106 may be greater than $10^{18}$ cm$^{-3}$, and in particular embodiments, approximately $10^{20}$ cm$^{-3}$. Likewise, the doping level of the implanted N-type layer may be $10^{18}$ cm$^{-3}$, where the exact value is determined by the targeted breakdown voltage of SiC P-N diode. Moreover, according to some embodiments, the thickness of the bulk substrate region 102 may be 350 µm or less. Notably, the implanted N-type layer 108 may be defined to be within the P-type region 106. In one implementation, the implanted N-type layer 108 is spaced 10 µm from the edge of P-type region 106. In other embodiments, the implanted N-type layer 108 may be spaced 5 µm from the edge of P-type region 106. The embodiments are not limited in this context. Generally, the N-type layer is spaced from the edge of P-type region 106 to ensure the N-type implanted layer 108 is contained within the P-type region 106.

Turning now to FIG. 4 there is shown a TVS diode 140 according to further embodiments of the disclosure. The embodiment of FIG. 4 shares similar features to the features of the TVS diode 130 of FIG. 3, while the TVS diode 140 does not include the JTE region 116.

Figure 5:
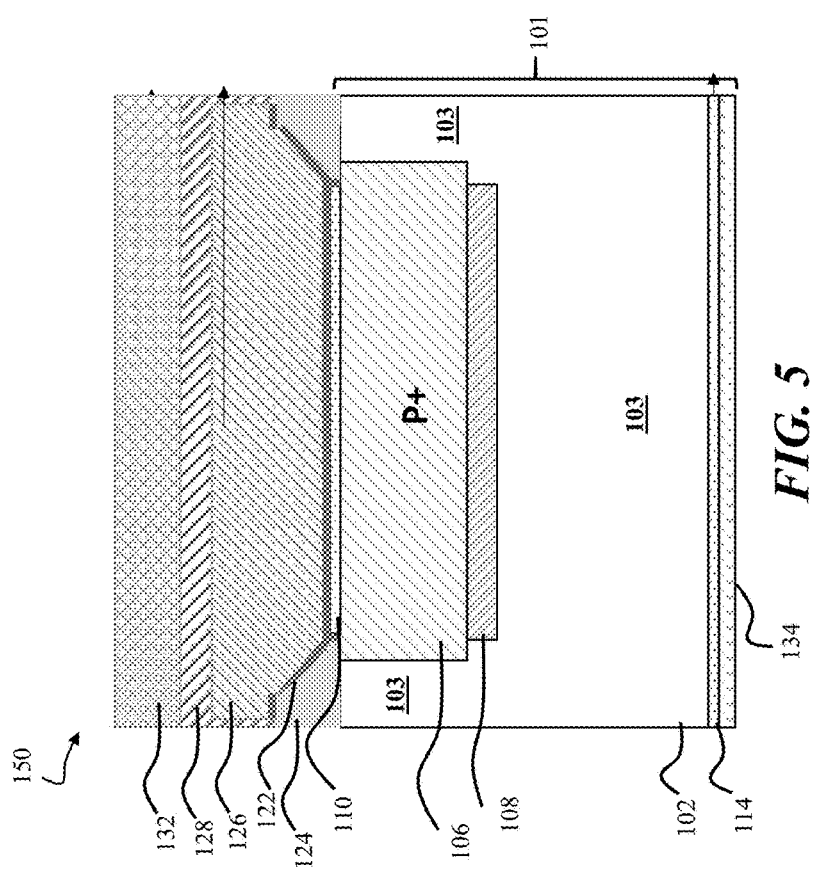
FIG. 5 shows a TVS diode according to still further embodiments of the disclosure.

Turning now to FIG. 5, there is shown a TVS diode 150 according to further embodiments of the disclosure. The embodiment of FIG. 4 shares similar features to the features of the TVS diode 140 of FIG. 4, while the TVS diode 150 does not include the SiC epitaxial layer 104. The doping concentration of the implanted N-type layer 108 may be adjusted to account for the absence of the SiC epitaxial layer 104.

As an example, for a substrate having a resistivity of 0.02 Ohm-cm in the bulk substrate region 102, the corresponding dopant concentration of N-type dopants is approximately $1.6 \times 10^{18}$ cm$^{-3}$. thus, the doping concentration of the implanted N-type layer 108 may be greater than $1.6 \times 10^{18}$ cm$^{-3}$. According to some embodiments, the resulting P/N diodes having the structure of FIG. 5 may exhibit a breakdown voltage greater than 20 V and less than 100 V.

Figure 6:
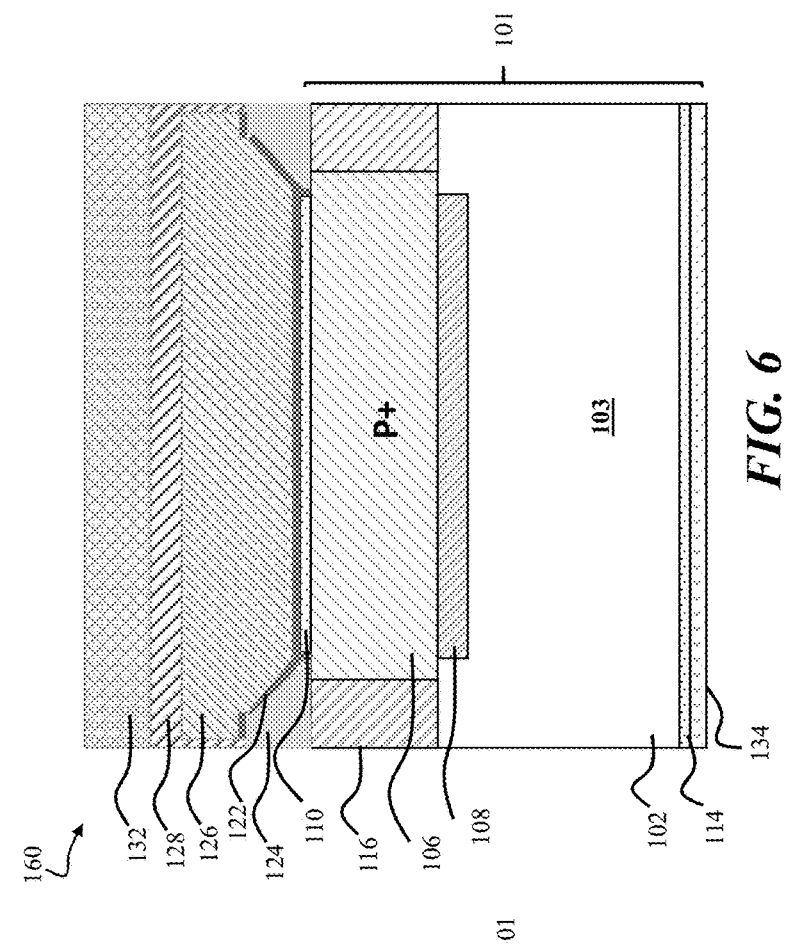
FIG. 6 shows a TVS diode according to additional embodiments of the disclosure.

Turning now to FIG. 6, there is shown a TVS diode 160 according to further embodiments of the disclosure. The embodiment of FIG. 6 shares similar features to the features of the TVS diode 150 of FIG. 5, with the addition of a JTE region 116, discussed above. The doping process for the JTE region 116 may be adjusted in consideration of the doping concentration of the P-type region 106, as well as the doping concentration of the bulk substrate region 102. Notably, the concentration of P-type dopant in the JTE region 116 is set to be less than the concentration of P-type dopant in the P-type region 106. Furthermore, because the JTE region 116 may be formed by ion implantation, the implant schedule for forming the JTE region 116 may be adjusted to compensate for the pre-existing doping concentration of N-type dopant in the bulk substrate region 102. Because the concentration of N-type dopant in the bulk substrate region 102 is relatively high, such as $1.6 \times 10^{18}$ cm$^{-3}$, the implantation dose of P-type ions used to form JTE region 116 will be adjusted to yield a net P-type dopant concentration of approximately $10^{17}$ cm$^{-3}$. Thus, the implantation of P-type ions may introduce a gross dopant concentration of more than $1.6 \times 10^{18}$ to compensate for an active N-type dopant concentration in the N-type dopant in the bulk substrate region 102. By way of comparison, in the embodiment of FIG. 2, where JTE region formation takes place by implanting into the SiC epitaxial layer 104, the N-type dopant concentration may be on the order $10^{16}$ cm$^{-3}$ in the regions of the SiC substrate 101 that are implanted with P-type ions. Thus, to yield a net P-type dopant concentration of approximately $10^{17}$ cm$^{-3}$ in the JTE region 116, the gross dopant concentration of P-type species in the embodiment of FIG. 2 may be just slightly higher, such as $1.5 \times 10^{17}$ cm$^{-3}$ to compensate for the N-type dopant concentration of $10^{16}$ cm$^{-3}$.

Turning now to FIG. 7A-7J, there is shown a process flow for assembling a TVS diode in accordance with embodiments of the disclosure. The process flow may be particularly applied to formation of the TVS diode 130, described above. At FIG. 7A, the SiC substrate 101 is provided as shown, including bulk substrate region 102, and SiC epitaxial layer 104.

In FIG. 7B, a first implantation mask 180 is provided, where the first implantation mask defines a first aperture 181, exposing a first portion of the N-type region 103, and in particular, a first portion of the SiC epitaxial layer 104. At the instance of FIG. 7B, implantation of P-type dopant species has taken place, leading to the formation of a P-type region 106. The ion energy for implanting P-type dopant ions may be tailored for the targeted thickness of the P-type region 106, such as several micrometers in depth. The position and lateral size of the P-type region 106 is defined by the first aperture 181. A suitable material for the first implantation mask 180 is silicon oxide, while the thickness of the silicon oxide may be tailored to contain ions so as to prevent implantation into the epitaxial SiC layer 104 underneath the first implantation mask 180.

In the instance of FIG. 7C, the first implantation mask 180 may be removed, and a second implantation mask 182 provided, where the second implantation mask 182 defines a second aperture 183, exposing a second portion of the N-type region 103, and in particular, a second portion of the SiC epitaxial layer 104. At the instance of FIG. 7C, implantation of N-type dopant species has taken place, leading to the formation of the implanted N-type region 108. The ion energy for implanting N-type dopant ions may be tailored for the targeted depth and thickness of the implanted N-type region 108, such as several micrometers below the upper surface 105. The position and lateral size of the P-type region 106 is defined by the second aperture 183. A suitable material for the second implantation mask 182 is silicon oxide, while the thickness of the silicon oxide may be tailored to contain ions so as to prevent implantation into the epitaxial SiC layer 104 underneath the second implantation mask 182. Notably, the second aperture 183 may be arranged with a dimension, D2 that is less than the dimension D1 of the first aperture 181. The second aperture 183 may also be aligned to fall within the first aperture 181 along both X-axis and Y-axis, so the implanted N-type layer 108 does not extend beyond the P-type region 106 in the X-Y plane.

In the instance of FIG. 7D, the second implantation mask 182 may be removed, and a third implantation mask 184 provided, where the third implantation mask 184 acts as a JTE mask and defines a third aperture 185, exposing a third portion of the N-type region 103, and in particular, a third portion of the SiC epitaxial layer 104. At the instance of FIG. 7D, implantation of P-type dopant species has taken place, leading to the formation of the JTE region 116. The third implantation mask 184 may be aligned to cover the P-type region 106 as shown. The ion energy for implanting P-type dopant ions may be tailored for the targeted depth of JTE region 116, such as several micrometers below the upper surface 105. The position and lateral size of the JTE region 116 is defined by the aperture 185. A suitable material for the third implantation mask 184 is silicon oxide, while the thickness of the silicon oxide may be tailored to contain ions so as to prevent implantation into the epitaxial SiC layer 104 underneath the third implantation mask 184. Notably, after the instance of FIG. 7D, an activation anneal procedure may be performed to activate N-dopants and P-dopants in the various regions defined by the procedures of FIGS. 7B-7D.

In various non-limiting embodiments, the depth $D_P$ of P-type region 106 may be 0.5 μm to 2 μm, while the width $W_P$ of P-type region 106 may vary according to the diode application, such as between several hundred microns to several millimeters. A larger P+ width will result in a larger overall TVS diode die size, facilitating a TVS having a higher power capability required for some applications. In various other non-limiting embodiments, the implanted N type layer 108, having a width $W_N$, may be offset from the edge of P-type region 106 by 5 μm to 10 μm (see dashed region, illustrating offset). The offset ensures the breakdown voltage is controlled and there is no premature breakdown of the device at the P+ junction corners.

Figure 7E:
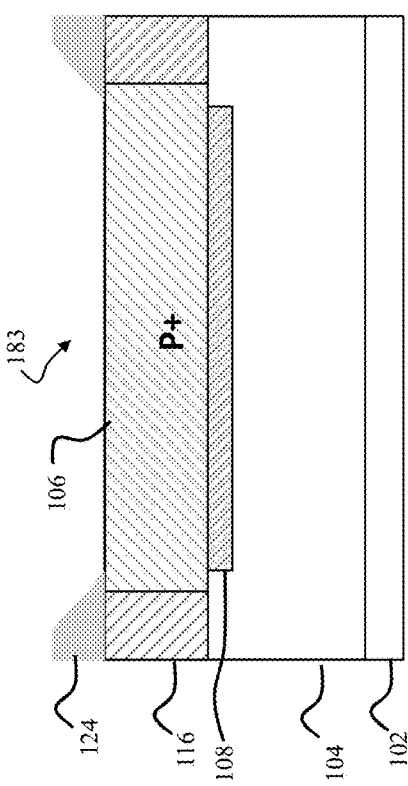

In a subsequent instance shown in FIG. 7E, an oxide layer has been deposited as represented by field oxide layer 124. The field oxide may be subject to known densification annealing and patterning to form an aperture 185, above the P-type region 106, as shown.

Figure 7F:
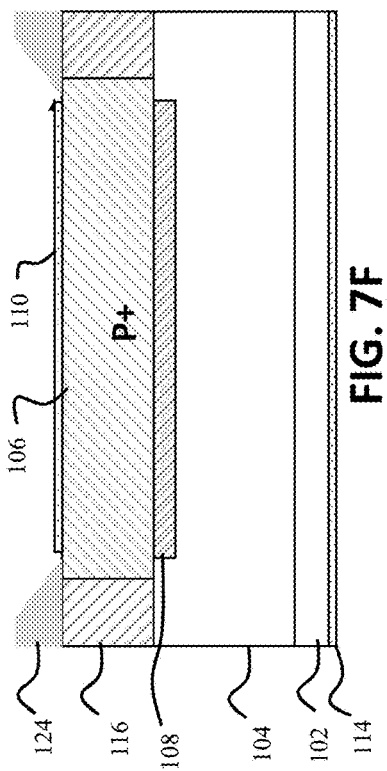

In a subsequent instance shown in FIG. 7F, an anode contact 110 and backside contact 114 have been deposited and annealed to form Ohmic contacts with the semiconductor regions of the TVS diode.

Figure 7G:
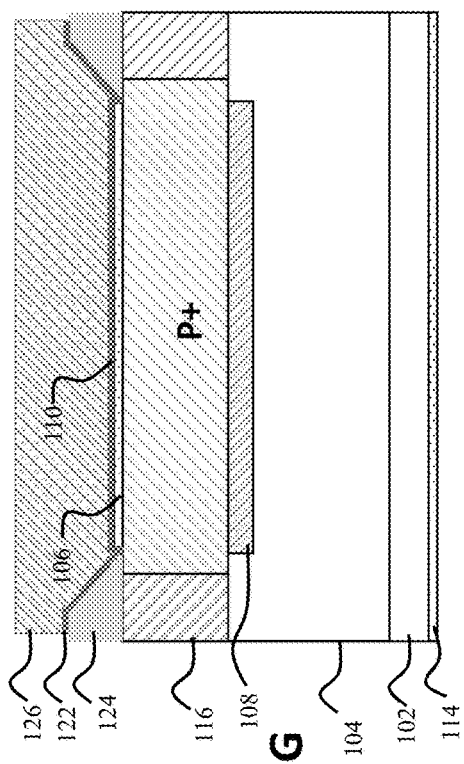
Figure 7H:
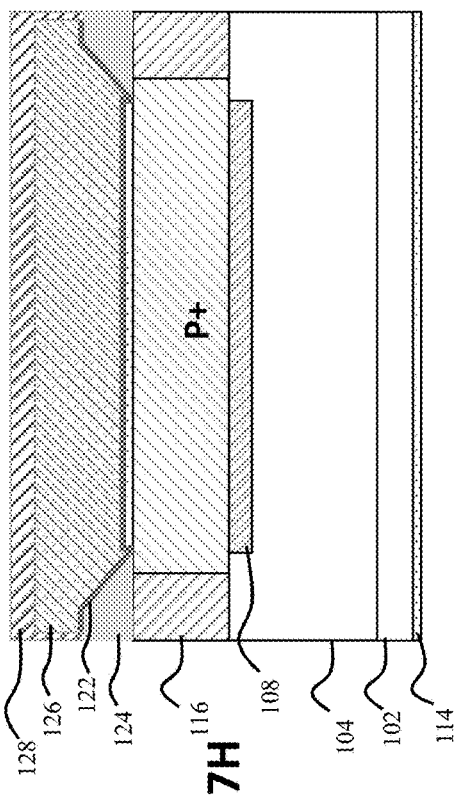
Figure 7J:
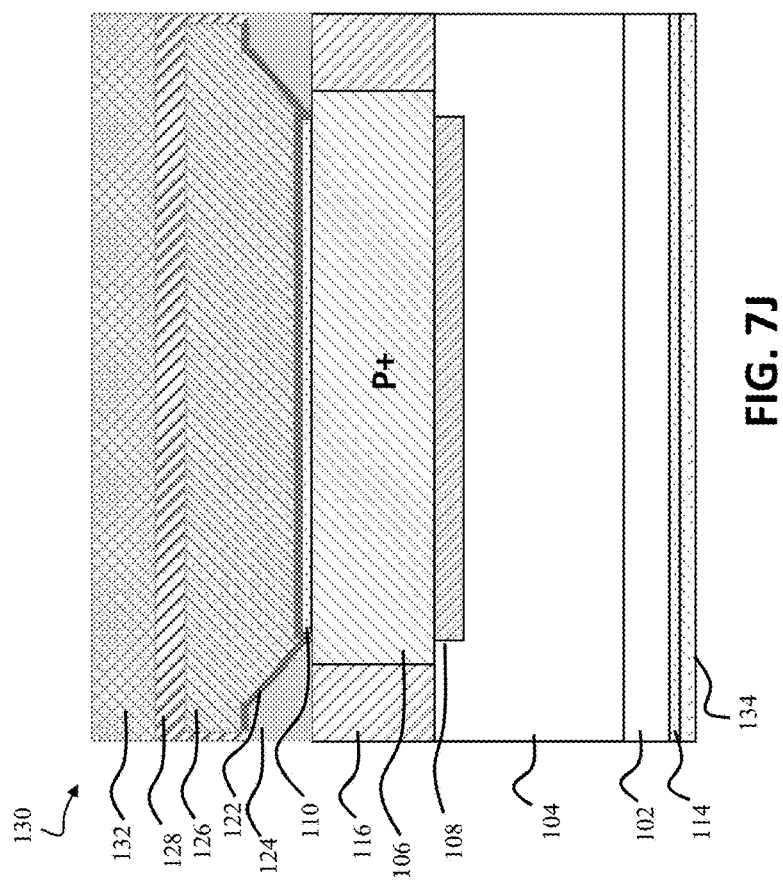
Figure 7I:
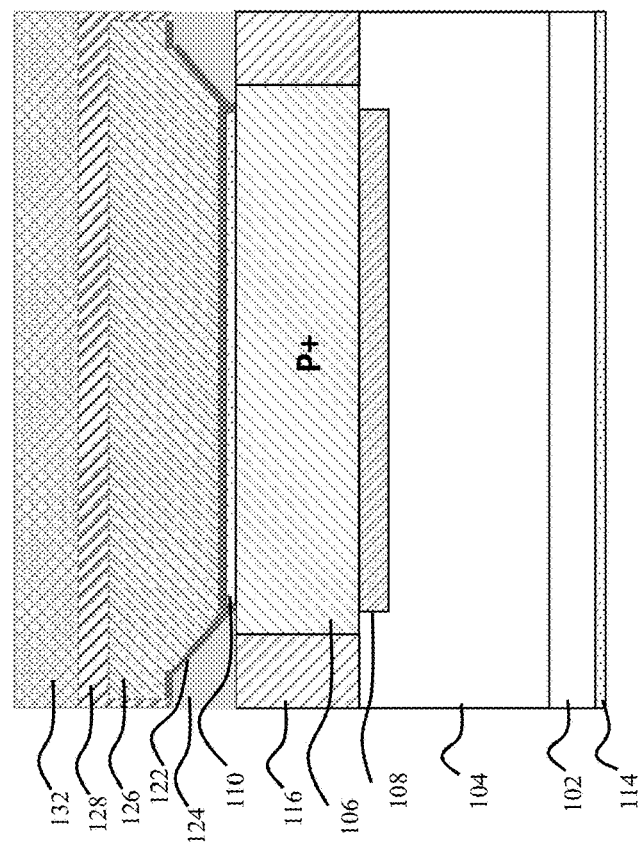

In a subsequent instance shown in FIG. 7G, a barrier metal layer 122 and metallization region 126 have been deposited, patterned and etched to form the contact structure shown. In a subsequent instance shown in FIG. 7H, a passivation layer 128 has been deposited, patterned and etched to form the structure shown. In a subsequent instance shown in FIG. 7I, a polymer layer 132 has been deposited, developed and cured. In a subsequent instance shown in FIG. 7J, a final metal layer 134 has been deposited on the backside surface as shown.

In various additional embodiments, any of the aforementioned TVS devices may be fabricated according to the following specifications: A) Net Doping concentration of P-type region 106: $10^{18}$ to $10^{20}$ cm$^{-3}$; B) Net Doping concentration of P-type JTE region 116: $1 \times 10^{17}$ to $5 \times 10^{17}$ cm$^{-3}$; C) Net doping concentration of N-epitaxial layer: $1 \times 10^{14}$ cm$^{-3}$ to $5 \times 10^{17}$ cm$^{-3}$; and D) Net doping concentration of implanted N-region: $1 \times 10^{16}$ to $5 \times 10^{18}$ cm$^{-3}$. This range of doping concentration will yield devices with breakdown voltages ranging from 15V to 600V.

In sum, the present embodiments provide various advantageous over Si-based TVS devices. The SiC-based TVS diodes of the present embodiments provide the ability to design a breakdown voltage in a semiconductor die over a range of voltages such as greater than 15 V up to 600 V, while avoiding the need to connect a plurality of die in series, as in the case of Si diodes for higher voltages. The present embodiments also provide a more robust diode for high temperature operation where leakage is reduced compared to Si TVS diodes.

Figure 8:
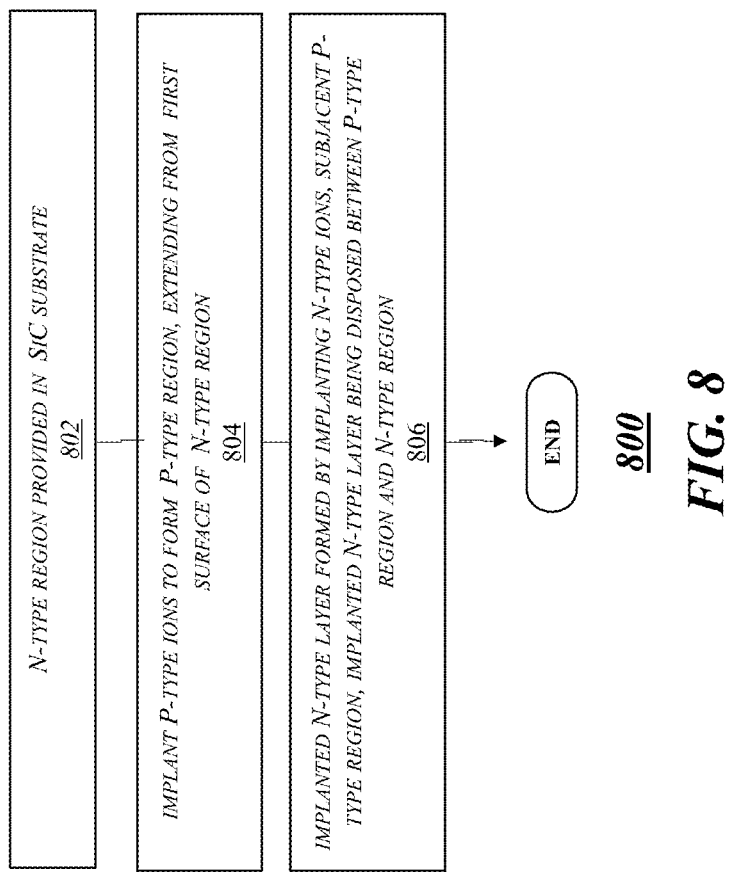
FIG. 8 shows an exemplary process flow 800, according to embodiments of the disclosure.

FIG. 8 shows an exemplary process flow 800, according to embodiments of the disclosure. At block 802 an N-type region is provided in a SiC substrate. The N-type region may include a bulk substrate region, the bulk substrate region having a first doping level, and an epitaxial SiC layer, having a second doping level, less than the first doping level.

At block 804 the operation is performed of implanting P-type ions to form a P-type region, extending from a first surface of the N-type region. At block 806 an implanted N-type layer is formed by implanting N-type ions, subjacent the P-type region. The implanted N-type layer may accordingly be disposed between the P-type region and the N-type region.

While devices and methods associated with TVS diodes have been described with reference to certain embodiments, it will be understood by those skilled in the art that various changes may be made and equivalents may be substituted without departing from the spirit and scope of the claims of the application. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

What is claimed is:

1. A device, comprising:
   a P-N diode, formed within a SiC substrate, and comprising:
   an N-type region formed within the SiC substrate;

a P-type region, formed in an upper portion of the N-type region, the P-type region extending along an upper surface of the SiC substrate;
an implanted N-type layer, the implanted N-type layer being disposed between the P-type region and the N-type region; and
a junction termination extension region (JTE region), disposed around the P-type region, and forming an interface region with the N-type region, the JTE region comprising a p-type dopant having a p-doping concentration greater than $10^{18}$ cm$^{-3}$, and greater than a doping level of the N-type region;
an anode contact disposed on the P-type region;
a backside contact disposed on a back surface of the SiC substrate, in contact with the N-type region;
a field oxide region defining a window over the P-type region;
a metal layer structure disposed in contact with the anode contact;
a passivation layer disposed over the metal layer structure; and
a polymer layer disposed over the metal layer structure, wherein the polymer layer and the passivation layer define an opening for contacting the metal layer structure.

2. The device of claim 1, wherein the P-type region comprises a first p-doping level, the JTE region comprising a second p-doping level, less than the first p-doping level.

3. The device of claim 2, wherein the P-type region comprises a lower surface, wherein the implanted N-type layer extends along the lower surface, and is offset from the junction termination extension region.

4. The device of claim 1, wherein the P-type region comprises a lower surface, the lower surface extending for a first distance between a first end and a second end, wherein the implanted N-type layer extends for a second distance along the lower surface, less than the first distance and is offset from the first end and the second end.

5. The device of claim 1, comprising a breakdown voltage greater than 20 V and less than 650 V.

6. The device of claim 1, wherein the N-type region comprises a bulk substrate region, wherein the implanted N-type layer is formed within the bulk substrate region.

7. The device of claim 6, wherein the P-N diode comprises a breakdown voltage greater than 20 V and less than 100 V.

8. A method of forming a SiC Transient Voltage Suppressor (TVS) diode, comprising:
providing an N-type region in a SiC substrate, and having a first surface that defines a surface of the SiC substrate;
implanting P-type ions to form a P-type region, extending along the first surface of the N-type region;
forming an implanted N-type layer by implanting N-type ions, subjacent the P-type region, wherein the implanted N-type layer is disposed between the P-type region and the N-type region;
forming a junction termination extension region (JTE region) by implanting a P-type dopant within the N-type region, around the P-type region, the JTE region comprising a p-doping concentration greater than $10^{18}$ cm$^{-3}$, and greater than a doping level of the N-type region;
forming an anode contact disposed on the P-type region;
forming a backside contact disposed on a back surface of the SiC substrate, in contact with the N-type region;
forming a field oxide region defining a window over the P-type region;
forming a metal layer structure disposed in contact with the anode contact;
forming a passivation layer disposed over the metal layer structure; and
forming a polymer layer disposed over the metal layer structure, wherein the polymer layer and the passivation layer define an opening for contacting the metal layer structure.

9. The method of claim 8, wherein the P-type region comprises a first p-doping level, the p-doping concentration of the JTE region having a second p-doping level, less than the first p-doping level.

10. The method of claim 9, wherein the forming the implanted N-type layer comprises implanting the N-type ions through a first implantation mask, wherein the forming the JTE region comprises implanting the P-type ions through a JTE mask, wherein the JTE mask is arranged so the P-type region to extends for a first distance between a first end and a second end, and wherein the first implantation mask is arranged so the implanted N-type layer extends for a second distance, less than the first distance and is offset from the first end and the second end.

11. The method of claim 8, wherein the forming the implanted N-type layer comprises implanting the N-type ions through a first implantation mask, wherein the forming the P-type region comprises implanting the P-type ions through a second implantation mask, wherein the second implantation mask is arranged so the P-type region to extends for a first distance between a first end and a second end, and wherein the first implantation mask is arranged so the implanted N-type layer extends for a second distance, less than the first distance and is offset from the first end and the second end.

12. A SiC Transient Voltage Suppressor (TVS) device, comprising:
a bulk substrate region, the bulk substrate region comprising N-type SiC having a first dopant level;
a P-type region, formed in an upper portion of the bulk substrate region and extending along an upper surface of the bulk substrate region;
an implanted N-type layer, the implanted N-type layer being disposed within the bulk substrate region, subjacent the P-type region, the implanted N-type layer comprising a second dopant level, greater than the first dopant level;
a junction termination extension region (JTE region), disposed around the P-type region, and forming an interface region with the bulk substrate region, the JTE region comprising a p-type dopant having a p-doping concentration greater than $10^{18}$ cm$^{-3}$, and greater than a doping level of the bulk substrate region;
an anode contact disposed on the P-type region;
a backside contact disposed on a back surface of the SiC substrate, in contact with the N-type region;
a field oxide region defining a window over the P-type region;
a metal layer structure disposed in contact with the anode contact;
a passivation layer disposed over the metal layer structure; and
a polymer layer disposed over the metal layer structure, wherein the polymer layer and the passivation layer define an opening for contacting the metal layer structure.

13. The SiC TVS device of claim 12, comprising a breakdown voltage greater than 20 V and less than 650 V.

* * * * *